United States Patent [19]

Halt

[11] 3,850,688

[45] Nov. 26, 1974

[54] OHMIC CONTACT FOR P-TYPE GROUP III-V SEMICONDUCTORS

[75] Inventor: Ira E. Halt, Chesterland, Ohio

[73] Assignee: General Electric Company, Schenectady, N.Y.

[22] Filed: Dec. 18, 1972

[21] Appl. No.: 316,130

Related U.S. Application Data

[62] Division of Ser. No. 213,660, Dec. 12, 1971, abandoned.

[52] U.S. Cl. ............. 117/217, 117/107, 317/234 L, 317/234 M

[51] Int. Cl. ............................ B44d 1/18, B44d 1/14

[58] Field of Search .... 317/234 L, 234 M; 117/217, 117/107

[56] References Cited

UNITED STATES PATENTS 3,349,476 10/1967 Pilkuhn et al. ...................... 117/217

OTHER PUBLICATIONS

Klohn et al., Variation of Contact Resistance of Metal–GaAs Contacts with Impurity Concentration and Its Device Implication, In J. Electrochem. Soc. Solid State Science 116, pages 507, 508, April 1969.

*Primary Examiner*—Cameron K. Weiffenbach
*Attorney, Agent, or Firm*—Norman C. Fulmer; Henry P. Truesdell; Frank L. Neuhauser

[57] ABSTRACT

Layers of gold, gold-zinc, and gold are successively evaporated onto p-type semiconductor material of Group III-V such as gallium phosphide, and sintered. Other metallic Group II elements can be substituted for the zinc. An initial layer of gold may first be evaporated and alloyed into the p-type material.

6 Claims, 8 Drawing Figures

PATENTED NOV 26 1974 3,850,688

OHMIC CONTACT FOR P-TYPE GROUP III-V SEMICONDUCTORS

CROSS-REFERENCES TO RELATED APPLICATIONS

This is a division of Application Ser. No. 213,660, filed Dec. 29, 1971, now abandoned. This application is related to application Ser. No. 101,971, filed Dec. 28, 1970, now U.S. Pat. No. 3,684,930, issued Aug. 15, 1972, assigned to the same assignee as the present invention.

BACKGROUND OF THE INVENTION

The invention is in the field of making ohmic contacts on semiconductor materials, and bonding the ohmic contact to a header. More particularly, the invention relates to ohmic contacts and bonding for Group III–V p-type semiconductors such as gallium arsenide and gallium phosphide.

Light-emitting diodes, i.e., solid-state lamps, are one type of device, among others, which make use of p-type semiconductor material. A light-emitting diode may comprise a p-n junction, which emits light when current is passed therethrough, and which is formed at the junction of p-type and an n-type semiconductor material such as gallium phosphide. The p-type and n-type regions are formed by doping the basic material with certain impurities in a suitable process, such as diffusion or epitaxial growth. In manufacture, a thin wafer of the basic material, such as gallium phosphide, is processed to form a p-n junction between and parallel to the larger faces of the wafer, and the wafer is then severed into a plurality of pellets each containing a p-n junction. Each pellet is then assembled into a lamp housing, making suitable electrical connections to the p-side and n-side thereof so that current can be made to flow through the p-n junction for causing light to be emitted. One way of accomplishing this is to place the pellet, p-side down, on a gold-plated Kovar header, and heat to over 500°C. to cause the pellet to fuse to the gold-plated header. A small "dot" contact is made to the n-side of the pellet, to complete the electrical connections; the header provides electrical connection to the p-side of the pellet. The aforesaid heating of the assembly to fuse the pellet to the header undesirably tends to reduce the light-emitting capability of the diode, and attempts to reduce the temperature employed for the fusing have tended to result in unsatisfactory bonding of the diode pellet to the header.

The above-referenced patent application of Collins and Halt discloses a contact and bonding for p-type Group III–V materials, comprising a combination of gold-germanium or gold-silicon alloy and zinc or other metallic Group II element, sintered into the p-type surface.

SUMMARY OF THE INVENTION

Objects of the invention are to provide improved electrical contact and bonding materials and methods for p-type Group III–V semiconductors, and to make the electrical contact and bonding by the use of relatively low temperatures.

The invention comprises, briefly and in a preferred embodiment, a contact and bonding combination of materials for p-type Group III–V semiconductors, such as gallium phosphide or gallium arsenide, comprising successive layers of gold, gold-zinc, and gold which are sintered at least partially into the p-type surface. A preferred method of manufacture comprises the steps of depositing a layer of gold onto a p-type surface of a wafer of Group III–V semiconductor material, depositing a combination layer of gold and a Group II metallic element over the gold layer, depositing an additional layer of gold over the combination layer, heating to sinter the deposited layers at least partially into the p-type surface of the wafer, and severing the wafer into pellets. Alternatively, the foregoing steps of the method may be preceded by depositing an initial layer of gold onto the p-type surface and sintering or alloying it into the surface.

DESCRIPTION OF THE PREFERRED EMBODIMENTS

Figure 1:
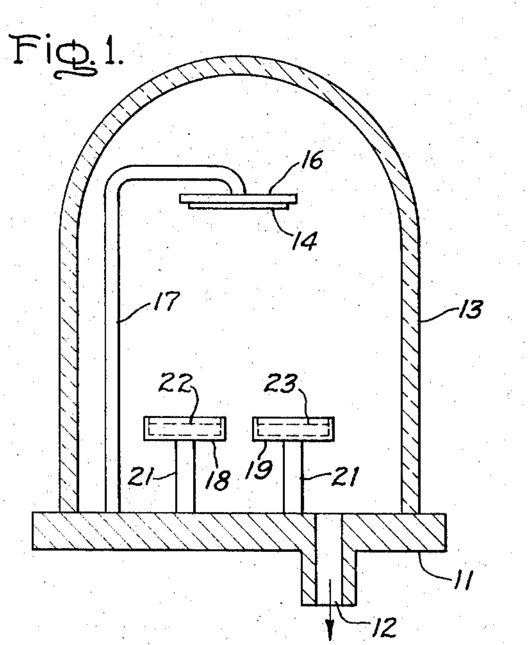
FIG. 1 is a cross-sectional view of a vacuum evaporation chamber, in which the electrical contact and bonding material of the invention is deposited onto a p-type surface of a semiconductor wafer.
Figure 2:
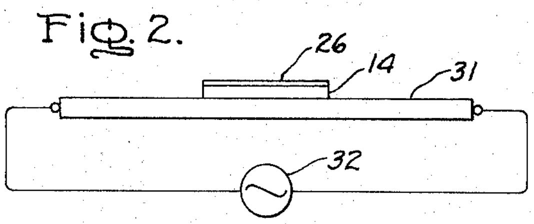

The vacuum evaporation apparatus of FIG. 1 consists of a base plate 11 provided with a vacuum port 12, and a cover 13, preferably of glass, which fits onto the base 11 in a vacuum tight manner. A wafer 14 having a p-type surface of Group III–V, such as gallium arsenide, gallium phosphide, or gallium arsenide phosphide, is supported, p-surface down, by means of being clamped or otherwise attached to a support plate 16 which is positioned within the vacuum chamber by means of bracket 17 attached to the base 11. A pair of boats 18 and 19 are supported from the base 11 by means of posts 21 which provide electrical and thermal insulation of the boats 18, 19 from the base 11. Preferably the boats 18 and 19 are made of metal and are arranged to be heated by passing electrical current directly through the metal of the boats. One of the boats 18 carries gold 22, and the other boat 19 carries a Group II metallic element 23, such as zinc of high purity (such as 99.999 percent purity), or may instead carry a combination of gold and a Group II metallic element. The apparatus is evacuated, and the boat 18 containing the gold 22 is heated electrically or by other means, so as to cause a layer of the gold to become deposited on the under surface of the wafer 14 on the *p*-side thereof, preferably to a thickness of about 500 to 5,000 A. The wafer 14, carrying the thin layer 26 of gold, is placed on a strip heater 31, as shown in FIG. 2, with the gold layer 26 on the upper side, and is heated to a temperature of about 500° to 550°C, momentarily, by means of electrical current from a current source 32, and in an inert or reducing atmosphere (such as hydrogen or nitrogen), so as to sinter or alloy the gold layer 26 into the p-type surface of the wafer 14. The wafer 14, after cooling sufficiently, is replaced in the apparatus of FIG. 1, in the same manner as before, and the apparatus is evacuated. Boat 18, containing gold 22, is heated as before, to cause a thin layer of gold to become deposited over the surface of the alloyed gold layer, and then the boat 19, containing the Group II metallic element such as zinc, is heated, simultaneously with the heating of boat 18, so as to cause a combination layer of gold and the Group II metallic element to become deposited onto the just-deposited gold layer. Alternatively, the boat 19 may contain a combination of gold and Group II metallic element, in which event only the boat 19 need be heated during the foregoing step. Next, the boat 18 is heated to deposit a final layer of gold over the preceding layers. Thus, a "sandwich" of layers of gold, gold-zinc or other metallic Group II element, and gold, have been deposited onto the initial alloyed gold layer. In this three-layer "sandwich," the first layer of gold may be about 500 to 5,000 Angstroms thick, the second layer of gold-Group II metallic element may be about 2,500 to 10,000 A thick with the quantity of Group II metallic element ranging from about 1 to 15 percent by weight of the accompanying gold, and the final layer of gold may be about 500 to 5,000 A thick.

Figure 3:
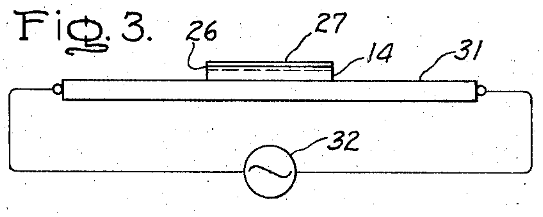
FIGS. 2 and 3 are side views showing the wafer, with evaporated material or materials thereon, being heated on an electrically heated strip heater.

The wafer 14, carrying the first alloyed layer 26 of gold and the sandwich layers 27, is again placed on a strip heater 31, as shown in FIG. 3, with the layers 26 and 27 on the upper side, and is heated by means of electrical current from a current source 32, in an inert or reducing atmosphere (such as hydrogen or nitrogen) to a temperature of about 500° to 550°C, momentarily, to sinter the three-layer sandwich 27 into the surface of the alloyed gold layer 26.

The above-described initial step of depositing a layer 26 of gold onto the p-type surface and sintering to alloy it into the surface as shown in FIG. 2, can be omitted, and the first gold layer of the three-layer sandwich can be deposited directly onto the p-type surface, if the thickness of the three-layer sandwich is adequately controlled so as to be relatively thin. The combined three layers of the three-layer sandwich must be sufficiently thin to adhere to the p-type surface (and not rise or peel off) during the subsequent heating and sintering, yet must be sufficiently thick so as to form an alloy with the surface region of the p-type material. In carrying out this alternative embodiment of the invention, the wafer is placed in the apparatus of FIG. 1, as described above, and the first gold layer of the three-layer sandwich is evaporated directly onto the p-type surface, followed by the gold-Group II layer, then the final gold layer, as described above. The combined thickness of the three layers should be controlled so that the total will be about 2,000 to 7,500 A in thickness. This can be achieved by making the first gold layer about 500 A thick, the gold-zinc layer about 1,000 A thick, and the final gold layer about 500 A thick. Thus, the first-described embodiment, though requiring extra steps in manufacture, has an advantage of reduced criticality of the layers' thicknesses because the initial gold layer alone is first alloyed into the p-type surface, whereupon the thicknesses of the rest of the layers is not so critical. In either of the embodiments, satisfactory results can be obtained if the middle layer of the sandwich consists only of zinc or other metallic Group II element, although the combination of gold therewith, as described above, has the advantage of aiding in preventing the zinc (or other metallic Group II element) from evaporating away during the heating and sintering step. When the sandwich is sintered, the zinc or other metallic Group II element becomes dispersed throughout the gold of the sandwich.

Figure 4:
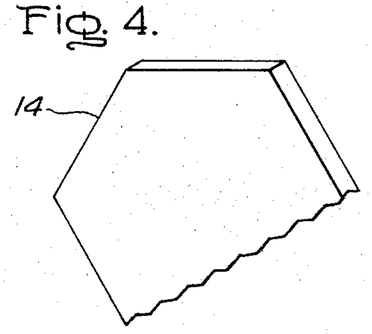
FIG. 4 is a perspective view of the wafer after the deposited materials have been fused into the p-type surface thereof as illustrated in FIG. 3.
Figure 5:
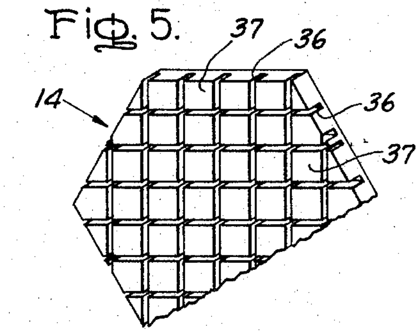
FIG. 5 is a perspective view of the wafer after the surface thereof has been scribed so that the wafer may be severed into a plurality of pellets.
Figure 6:
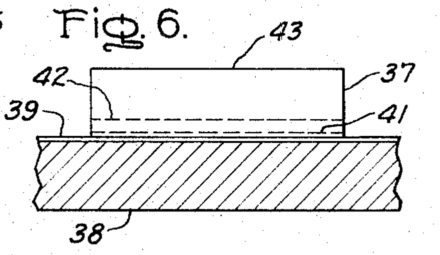
FIG. 6 is a side view of a pellet, placed p-side down on a header.

At this stage, the wafer 14 may look somewhat as shown in FIG. 4, and then is scribed in a criss-cross manner as indicated by the numerals 36 in FIG. 5 to define individual pellets 37, and then is severed to provide a plurality of individual pellets 37. A pellet 37 is positioned, p-side down, onto a gold-plated header, as shown in FIG. 6, in which the header 38, which may be of Kovar, is plated with a layer of gold 39. The dashed line 41 indicates the depth of penetration into the pellet 37 of the sintered composition of gold and Group II metallic element, as has been described above. Assuming that the wafer 37 contains a p-n junction, this junction would be located approximately as indicated by the dashed line 42, the upper portion 43 of the wafer 37 being of n-type material.

The header 38 and pellet 37, as shown in FIG. 6, are then heated by any convenient means, such as in a furnace or by placing the header 38 on a strip heater, in an inert or reducing atmosphere (such as hydrogen or nitrogen) to a temperature between 400°C and 500°C, momentarily, to fuse the pellet 37 to the gold-plating 39 of the header 38, which is accomplished due to melting of the gold 39 and the composition material which has been sintered into the p-surface of the pellet as described above.

Figure 8:
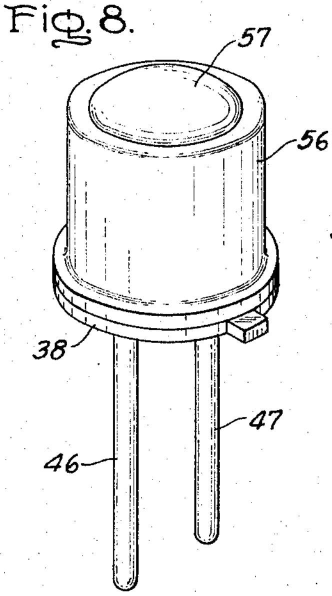
FIG. 8 is a perspective view of a solid-state lamp having a lens housing attached to the header assembly of FIG. 6.
Figure 7:
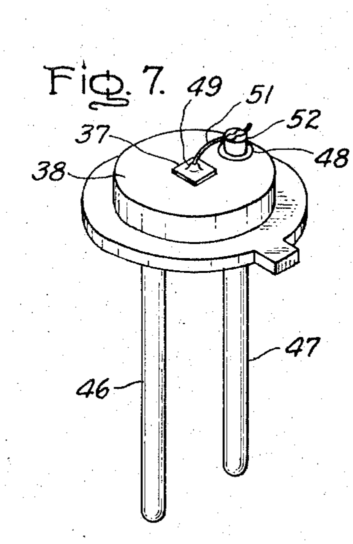
FIG. 7 is a perspective view of the pellet on a header.

FIG. 7 shows a typical header 38, with the pellet 37 bonded thereto as described above. A first lead wire or post 46 is attached to the header 38, and a second lead wire or post 47 extends through an opening in the header 38 and is attached to and insulated from the header by means of an insulating material 48 such as glass. A dot size contact 49 is provided on the upper or n-surface of the pellet 38, by well-known means, and a connector fine wire 51 is electrically and mechanically attached to the dot contact 49 and the upper end 52 of the second connector wire 47. A protective housing 56 may be positioned over and attached to the header 38, as shown in FIG. 8, and may be provided with a lens 57 in an opening at the outer ends thereof, so that when the light-emitting diode wafer 37 emits light due to current being passed through the p-n junction 42 thereof by means of voltage applied to the lead wires 46 and 47, the emitted light will be focused by the lens 57 in a desired manner.

The electrical contact and bonding material composition of the invention, as described above, permits bonding of the pellet 37 to the header 38 at a lower temperature, for example approximately 100°C lower, than the temperature heretofore required for bonding p-type material directly to the gold-plating 39 of the header 38. At the same time, a bond of very high mechanical strength is achieved. Thus, good bonding is achieved at reduced temperature, thus reducing the likelihood of damaging the light-emitting capability of the p-n junction diode.

The method of the invention, by applying the electrical contact and bonding material to the p-surface of the pellets 37, permits temporary electrical connection to be made to the p-side, while another electrical contact is made to the dot contact 49 which has been previously applied to the n-side of the diode in well-known manner, so that the light emission capability and other characteristics of the diode can be measured before the diode is bonded to a header, whereby defective diodes can be rejected before they are bonded to the relatively expensive header assembly.

The invention, in addition to achieving good bonding at a low temperature, also provides a highly desirable low resistance of the connection between the p-surface and the header, resulting in increased efficiency, greater light output, and lower heating of the lamp during operation.

The useful function of the zinc or other metallic Group II element in the contact of the invention, is that it "dopes" the gold as alloyed with the p-type Group III–V material so as to provide a low-resistance ohmic contact. However, metallic Group II elements do not "wet" well onto p-type Group III–V materials, whereas the accompanying gold performs this function well. Group II metallic elements have relatively high vapor pressures and tend to evaporate when heated for the sintering step. A purpose of the gold layers blanking the Group II metallic layer, is to reduce or prevent evaporation of the Group II metallic element, since it disperses throughout the gold instead of evaporating, as it and the gold become fused into the surface of the p-type Group III–V material during the steps of heating and sintering.

The invention is useful in applying a small dot contact to the surface of p-type Group III–V material, which can be achieved by evaporating the gold and metallic Group II element through a small opening in a mask.

While preferred embodiments of the invention have been shown and described, various other embodiments and modifications thereof will become apparent to persons skilled in the art, and will fall within the scope of the invention as defined in the following claims.

What I claim as new and desire to secure by Letters Patent of the United States is:

1. A method of making an ohmic contact to a p-type Group III–V material, comprising the steps of depositing a layer of gold onto a surface of said material, depositing a layer comprising zinc over the gold layer, depositing a layer of gold over said last named layer, and heating to sinter the deposited layers at least partially into said surface of the material.

2. A method as claimed in claim 1, in which said layer comprising zinc includes gold in combination with the zinc.

3. A method as claimed in claim 2, in which the first-named gold layer prior to sintering has a thickness of from about 500 to 5,000 A, in which said layer comprising zinc and gold prior to sintering has a thickness of from about 1,000 to 10,000 A with the quantity of zinc ranging from about 1 to 15 percent by weight of the accompanying gold, and the last-named gold layer prior to sintering has a thickness of from about 500 to 5,000 A.

4. A method as claimed in claim 2, in which said Group III–V material is gallium arsenide, gallium phosphide, or gallium arsenide phosphide.

5. A method as claimed in claim 1, including the additional initial steps of depositing a preliminary layer of gold onto said surface of the material, and heating to form at said surface an alloy of gold and the p-type Group III–V material.

6. a method as claimed in claim 5, in which said preliminary layer of gold has a thickness of from about 500 to 5,000 A prior to being heated to form said alloy.

* * * * *